(12) United States Patent
Boerstler et al.

(10) Patent No.: US 7,969,250 B2
(45) Date of Patent: Jun. 28, 2011

(54) STRUCTURE FOR A PROGRAMMABLE INTERPOLATIVE VOLTAGE CONTROLLED OSCILLATOR WITH ADJUSTABLE RANGE

(75) Inventors: David W. Boerstler, Round Rock, TX (US); Eskinder Hailu, Sunnyvale, CA (US); Masaaki Kaneko, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 12/129,811

(22) Filed: May 30, 2008

(65) Prior Publication Data

US 2009/0183136 A1    Jul. 16, 2009

Related U.S. Application Data

(63) Continuation-in-part of application No. 11/853,905, filed on Sep. 12, 2007, now abandoned.

(51) Int. Cl.
*H03B 27/00* (2006.01)
(52) U.S. Cl. ............... 331/57; 331/2; 331/1 A; 327/156; 327/159
(58) Field of Classification Search ............... 331/2, 57, 331/1 A; 327/156, 159
See application file for complete search history.

(56) References Cited

U.S. PATENT DOCUMENTS

| | | | |
|---|---|---|---|
| 5,191,301 A | 3/1993 | Mullgrav, Jr. | |
| 6,204,694 B1 | 3/2001 | Sunter et al. | |
| 6,353,369 B1 | 3/2002 | Boerstler | |
| 6,396,358 B1 | 5/2002 | Poss et al. | |
| 6,529,084 B1 | 3/2003 | Boerstler et al. | |
| 6,842,082 B2 * | 1/2005 | Tan | 331/175 |
| 7,233,212 B2 | 6/2007 | Boerstler et al. | |

* cited by examiner

*Primary Examiner* — Arnold Kinkead
(74) *Attorney, Agent, or Firm* — Stephen J. Walder, Jr.; Matthew B. Talpis

(57) ABSTRACT

A design structure for a programmable interpolative voltage controlled oscillator (VCO) with adjustable frequency range output is provided. Programmable delay cells whose size is modifiable based on control inputs to the programmable delay cells are utilized. A different set of control inputs may be provided to programmable delay cells of an inner sub-ring from the set of control inputs provided to programmable delay cells of a main ring of the VCO. The minimum frequency output of the VCO is governed by the main ring programmable delay cell strength with the maximum frequency output of the VCO being governed by a ratio of strengths of the main ring programmable delay cells to the inner sub-ring programmable delay cell. By modifying the control inputs to the inner sub-ring and main ring programmable delay cells, the minimum and maximum frequency outputs, and thus the range between these two frequency outputs, are made programmable.

22 Claims, 8 Drawing Sheets

STRUCTURE FOR A PROGRAMMABLE INTERPOLATIVE VOLTAGE CONTROLLED OSCILLATOR WITH ADJUSTABLE RANGE

BACKGROUND OF THE INVENTION

1. Field of the Invention

The present application relates generally to a design structure and more specifically, to a design structure for a programmable interpolative voltage controlled oscillator with adjustable range.

2. Background of the Invention

A voltage-controlled oscillator (VCO) is an electronic oscillator specifically designed to be controlled in oscillation frequency by a voltage input. The VCO is a circuit that generates an oscillating signal at a frequency controlled by a voltage supplied from an external source. The frequency of oscillation, or rate of repetition, is varied with an applied DC voltage, while modulating signals may be fed into the VCO to generate frequency modulation (FM), phase modulation (PM), and pulse-width modulation (PWM). VCOs are basic building blocks of many electronic systems and may be found in computer disk drives, wireless electronic equipment, such as cellular telephones, and other systems having an oscillation frequency controlled by an applied tuning voltage. One typical use of a VCO is in phase-locked loops (PLLs) of integrated circuit devices.

A phase-locked loop (PLL) is a closed loop feedback control system that generates an output signal in relation to the frequency and phase of an input, or reference, signal. The PLL automatically responds to the frequency and phase of the input signal by raising or lowering the frequency of a controlled oscillator until it is matched to the reference in both frequency and phase. PLLs are widely used in computing devices, telecommunications systems, radio systems, and other electronic applications where it is desired to stabilize a generated signal or to detect signals in the presence of noise. Since an integrated circuit can hold a complete PLL, the use of PLLs in modern electronic devices is widespread.

PLLs generally include a phase detector circuit, a low pass filter circuit, and a VCO placed in a negative feedback configuration. In addition to these elements, a frequency divider circuit may be provided in the feedback path, the reference signal path, or both, in order to make the PLL's output signal an integer multiple of the reference signal. The phase detector compares the phase of two inputs and outputs a corrective signal to control the VCO such that the phase difference between the two inputs becomes zero. The two inputs are a reference signal and the divided output of the VCO.

Various types of phase detector circuits are known including simple XOR gates, four-quadrant multiplier (or "mixer") circuits, proportional phase detector circuits, and the like. A more complex phase detector uses a simple state machine to determine which of the two signals has a zero-crossing earlier or more often. This brings the PLL into lock even when it is off frequency. This type of phase detector circuit is known as a phase frequency detector (PFD).

The VCO is used to generate a periodic output signal. For example, if the VCO is at approximately the same frequency as the reference signal, and if the phase of the VCO falls behind the phase of the reference signal, the phase detector circuit causes a charge pump of the PLL to charge the control voltage so that the VCO speeds up. Likewise, if the phase of the VCO progresses ahead of the phase of the reference signal, the phase detector circuit causes the charge pump to change the control voltage to slow down the VCO. The low-pass filter smoothes out the abrupt control inputs from the charge pump. Since the frequency of the VCO may be far from the frequency of the reference signal, practical phase detectors may also respond to frequency differences, such as by using a phase frequency detector (PFD), so as to increase the lock-in range of allowable inputs.

As discussed above, most PLLs also include a frequency divider circuit between the VCO and the feedback input to the phase detector circuit in order to produce a frequency synthesizer. This frequency divider circuit may be programmable so as to achieve different output or feedback frequencies of the output signal. Some PLLs may also include a frequency divider circuit between the reference clock input and the reference input to the phase detector circuit. If this frequency divider circuit divides the frequency of the reference signal by M, the inclusion of this frequency divider circuit between the reference clock input and the reference input to the phase detector circuit allows the VCO to multiply the reference signal's frequency by N/M, where N is the multiplier provided by the VCO.

There are a number of different designs for VCOs that are generally known in the art. One basic design for a VCO is the ring oscillator. Ring oscillators have a number of delay stages of amplifiers wherein the amount of delay of each stage is controlled by an input voltage or current. The frequency can be further controlled by varying the capacitance of each stage. The output of the Nth stage is coupled to the input of the first stage. The ring oscillator's frequency is inversely proportional to twice the total delay. Very high frequencies can be obtained with ring oscillators by decreasing the delay and decreasing the number of delay stages, but the oscillators are susceptible to noise and jitter. Ring oscillators, depending on the phase noise requirement, typically require much less power and area than known inductor-capacitor (LC) oscillators or multi-vibrator oscillators.

FIG. 1 shows a typical ring voltage controlled oscillator 130 in which a number of delay stages 142, 144, 146 drive each other in a ring to achieve oscillation. Load capacitors 152, 154, 156 on the output of each delay stage can be varied to tune the ring, such as in U.S. Pat. No. 5,191,301 entitled "Integrated Differential Voltage Controlled Ring Oscillator," issued to Mullgrav on Mar. 2, 1993, assigned to the same assignee as the present application, and herein incorporated by reference in its entirety.

The frequency of oscillation can be stated as: $F = \frac{1}{2}[N(T_d + T_c)]^{-1}$ where $T_d$ is the fixed time delay per stage which represents the wiring and parasitic capacitance, $T_c$ is the capacitor variable time delay per stage, and N is the number of delay stages 142, 144, 146. $T_c$ varies as the capacitance values of load capacitors 152, 154, 156 are varied. In this arrangement, large tuning ranges can be achieved with large capacitor variations. In order to get a 2:1 frequency range, for example, $T_c$ must be equal to $T_d$, i.e., for each stage, the fixed time delay must be equal to the variable time delay. As $T_c$ is increased, however, the fixed delay $T_d$ also increases. Thus, to achieve a larger frequency range, a larger capacitance is required generating more circuit area and more input and dissipative power.

FIG. 2 shows a typical delay interpolating tuning ring oscillator 230. As the control voltage 262 changes, the delay interpolator 270 adds or interpolates the delay from two different delay paths 264 and 266. If the control voltage 262 chooses more of the N1 path 266 input, the frequency is increased. If the control voltage 262 chooses more of the N2 path 264 input, the frequency is decreased. Mathematically, the frequency of oscillation is: $F = \frac{1}{2}[T_d(K*N1+(1-K)*N2)]^{-1}$ where $T_d$ is the fixed time delay per stage, N1 is the equivalent number of delay stages for the short path 266, N2 is the equivalent number of delay stages for the long path 264, and K is an interpolation variable. As an example, if N1=3 and N2=5, and K varies between 0 to 1 based on the control voltage, the oscillation frequency varies by a factor of 5/3. Theoretically, however, the total frequency range cannot vary by more than 1.6:1 for a single interpolation stage.

FIG. 3 is a diagram of a known interpolative VCO provided in a star structure having an outer ring of main inverters and an inner sub-ring of inverters configured in a star formation. With the interpolative VCO 300 of FIG. 3, the inner sub-ring inverters 310-318 interpolate in phase with the main inverters 320-328 on the outside of the ring. In the known interpolative VCO 300 architecture, the external main ring inverter size is equal to the internal control path, or sub-ring path, inverter size. The stage number of the main loop is Y and the stage number of the internal sub-ring is X, where Y and X are odd numbered in the depicted example and Y is greater than X. In particular, in the depicted example, Y is 5 and X is 3.

As is generally known in the art, the term "size" is synonymous with "strength." The "strength" of a path is proportional to the device W/L ratio. Normally L is set to the minimum channel length supported by the technology for the most area efficiency. Strength may also be considered in terms of current. For a device in saturation: $I=\frac{1}{2}\mu Cox\ W/L(V_{gs}-V_T)^2=\frac{1}{2}gm(V_{gs}-V_T)$ where $gm=\mu Cox\ W/L(V_{gs}-V_T)$, and where $V_T$ is the threshold voltage, gm is the transconductance, $V_{gs}$ is the gate-to-source voltage, W is the device width, L is the device length, Cox is the oxide capacitance, and μ is the mobility.

Returning to FIG. 3, the paths of the inner sub-ring inverters 310-318 are enabled by the application of a control voltage Vc of the VCO 300. The amount by which the inner sub-ring inverters 310-318 change the frequency of the outer ring inverters 320-328 is controlled by the amount of the control voltage Vc applied to the transistors 330-338. This control voltage may range from Vc=0 to Vc=Vdd. When Vc=Vdd, the interpolative VCO 300 may generate a maximum frequency. When Vc=0, the interpolative VCO 300 may generate a minimum frequency. However, it should be appreciated that in this known interpolative VCO 300 architecture, the ratio of maximum to minimum frequency is fixed to about 2.5. This is because the size of the inverters is fixed.

BRIEF SUMMARY OF THE INVENTION

The illustrative embodiments provide a programmable interpolative voltage controlled oscillator (VCO) with adjustable frequency range output. With the VCO of the illustrative embodiments, the fixed size inverters of known architectures are replaced with programmable delay cells whose size is modifiable based on control inputs to the programmable delay cells. A different set of control inputs may be provided to programmable delay cells of an inner sub-ring of the VCO from the set of control inputs provided to programmable delay cells of an outer or main ring of the VCO. The minimum frequency output of the VCO is governed by the main ring programmable delay cell size with the maximum frequency output of the VCO being governed by a ratio of strength of the main ring programmable delay cells to the strength of the inner sub-ring programmable delay cell strength as determined from the programming of these delay cells. As a result, by modifying the control inputs to the inner sub-ring and main ring programmable delay cells, the minimum and maximum frequency outputs and thus the range between these two frequency outputs, may be made programmable.

In one illustrative embodiment, an apparatus is provided that comprises a controller and a programmable voltage controlled oscillator (VCO) coupled to the controller. The programmable VCO may comprise a plurality of first programmable delay cells coupled to one another, a plurality of second programmable delay cells coupled to one another, and a plurality of control gates coupled to the plurality of second programmable delay cells. A first control signal may be sent from the controller to the plurality of first programmable delay cells to enable a first number of buffers in each of the first programmable delay cells. A second control signal may be sent from the controller to the plurality of second programmable delay cells to enable a second number of buffers in each of the second programmable delay cells, and a control voltage may be applied to the plurality of control gates.

The plurality of first programmable delay cells may be coupled to one another in a main ring formation. The plurality of second programmable delay cells may be coupled to one another in an inner ring formation. The inner ring formation may be coupled to the main ring formation.

The controller may read delay cell strength information from a first data storage device for the first programmable delay cells and the second programmable delay cells. The first control signal and the second control signal may be generated by the controller based on the delay cell strength information. The controller may read desired VCO operational characteristic information from a second data storage. The first control signal and the second control signal may be generated by the controller based on both the delay cell strength information and the desired VCO operational characteristic information. The desired VCO operational characteristic information may be used by the controller along with the delay cell strength information to determine how many of the buffers in the delay cells in the plurality of first programmable delay cells and how many of the buffers in the delay cells in the plurality of second programmable delay cells to enable.

The desired VCO operational characteristic information may be one or more of a set of user defined parameters or system defined parameters for governing a desired operation of the VCO. The user defined parameters or system defined parameters may specify at least one of a desired VCO gain, frequency range, or maximum frequency to minimum frequency (Fmax/Fmin) ratio.

The delay cells in the plurality of first programmable delay cells may each have an offset buffer and a first number of additional buffers that are selectively enabled based on a setting of bits in the first control signal. The delay cells in the plurality of second programmable delay cells may each have an offset buffer and a second number of additional buffers that are selectively enabled based on a setting of bits in the second control signal.

The apparatus may be a phase-locked loop (PLL) circuit. Moreover, the apparatus may be a data processing system. The controller and programmable VCO may be part of a phase-locked loop (PLL) circuit of the data processing system. The PLL circuit may provide an internal clock signal to one or more units of the data processing system.

In another illustrative embodiment, a method of controlling an operation of a programmable voltage controlled oscillator (VCO) is provided. The method may comprise generating a first control signal for enabling a first number of buffers in each of a plurality of first programmable delay cells of the programmable VCO, the plurality of first programmable delay cells being coupled to one another. The method may further comprise generating a second control signal for enabling a second number of buffers in each of a plurality of second programmable delay cells of the programmable VCO, the plurality of second programmable delay cells being coupled to one another. Moreover, the method may comprise providing a control voltage to a plurality of control gates coupled to the plurality of second programmable delay cells. The plurality of first programmable delay cells may be coupled to one another in a main ring formation. The plurality of second programmable delay cells may be coupled to one another in an inner ring formation. The inner ring formation may be coupled to the main ring formation.

The method may also comprise reading delay cell strength information from a first data storage device for the first programmable delay cells and the second programmable delay cells and reading desired VCO operational characteristic information from a second data storage. The first control signal and the second control signal may be generated based on both the delay cell strength information and the desired VCO operational characteristic information. The desired VCO operational characteristic information may be one or more of a set of user defined parameters or system defined parameters for governing a desired operation of the VCO. The user defined parameters or system defined parameters may specify at least one of a desired VCO gain, frequency range, or Fmax/Fmin ratio. The desired VCO operational characteristic information may be used along with the delay cell strength information to determine how many of the buffers in the delay cells in the plurality of first programmable delay cells and how many of the buffers in the delay cells in the plurality of second programmable delay cells to enable.

The delay cells in the plurality of first programmable delay cells may each have an offset buffer and a first number of additional buffers that are selectively enabled based on a setting of bits in the first control signal. The delay cells in the plurality of second programmable delay cells may each have an offset buffer and a second number of additional buffers that are selectively enabled based on a setting of bits in the second control signal.

In yet another illustrative embodiment, a computer program product comprising a computer useable medium having a computer readable program is provided. When executed on a computing device, the computer readable program may cause the computing device to perform various ones, and combinations of, the operations outlined above with regard to the method illustrative embodiment.

In another illustrative embodiment, a design structure embodied in a machine readable medium for designing, manufacturing, or testing an integrated circuit is provided. The design structure may be encoded on a machine-readable data storage medium and may comprise elements that, when processed in a computer-aided design system, generates a machine-executable representation of a phase locked loop circuit. The design structure may be a hardware description language (HDL) design structure. The design structure may comprise a netlist and may reside on a storage medium as a data format used for the exchange of layout data of integrated circuits.

In yet another illustrative embodiment, a method in a computer-aided design system for generating a functional design model of a phase locked loop circuit is provided.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a programmable interpolative voltage controlled oscillator (VCO) with an adjustable output frequency range. The programmability and adjustability are achieved by providing programmable delay cells having one or more buffers provided therein. Based on control inputs provided to the programmable delay cells, one or more of the buffers of each of the programmable delay cells may be enabled to thereby control the strength or size of the programmable delay cell. By properly providing control inputs to a plurality of programmable delay cells arranged in an interpolative VCO, various combinations of strengths or sizes of the delay elements of the VCO may be achieved and thus, the range of possible output frequencies of the VCO may be adjusted, i.e. the minimum and maximum output frequency of the range may be adjusted to a desired range.

Figure 4:
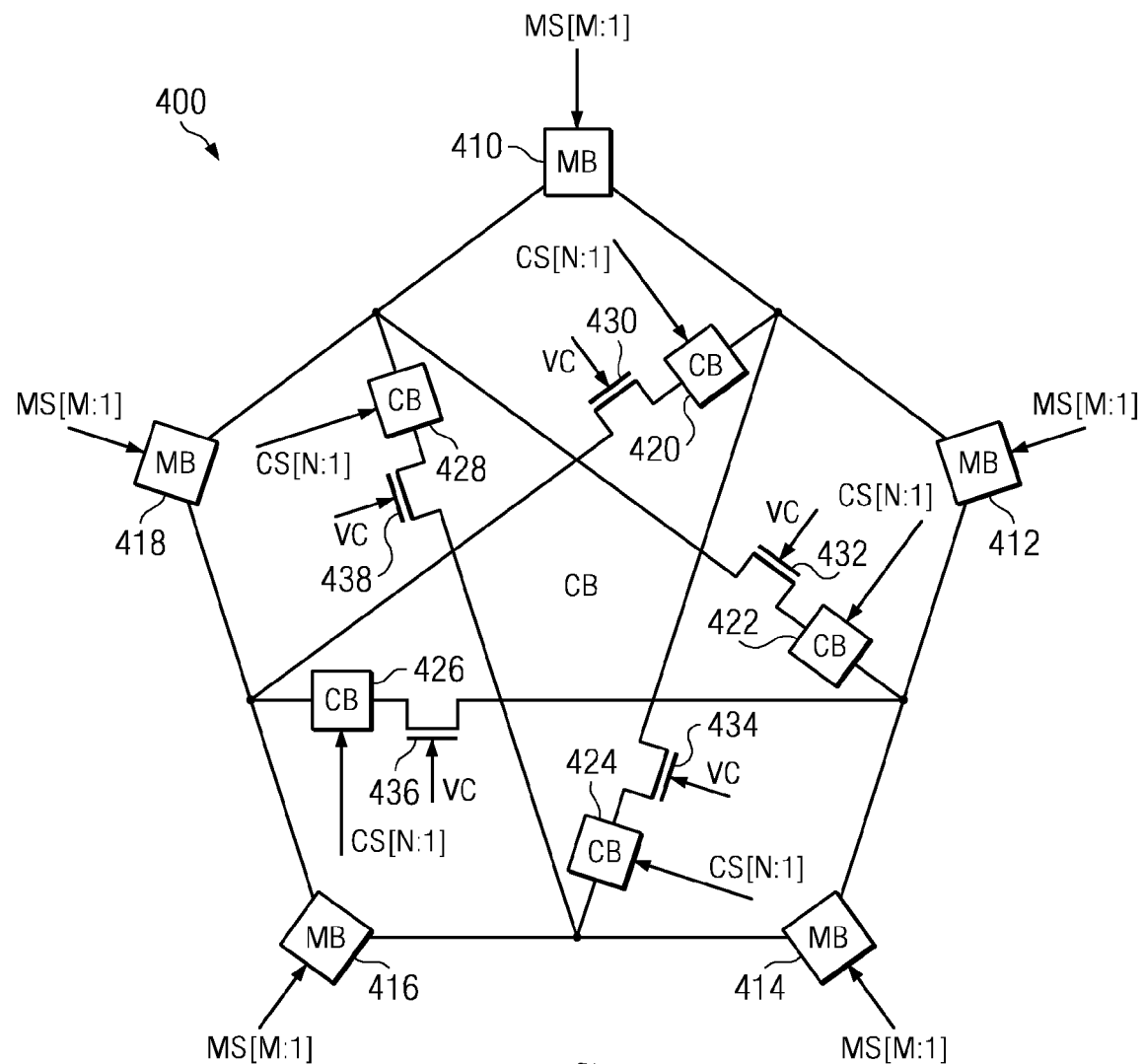
FIG. 4 is an exemplary diagram of an interpolative VCO having a star structure comprising an outer main ring and inner sub-ring of programmable delay cells in accordance with one illustrative embodiment.

FIG. 4 is an exemplary diagram of a programmable interpolative VCO having a star structure comprising an outer main ring and inner sub-ring of programmable delay cells in accordance with one illustrative embodiment. It should be appreciated that the particular architecture shown in FIG. 4 is not required but is chosen for illustrative purposes only. Thus, modifications to the architecture shown may be made without departing from the spirit and scope of the present invention. For example, a star configuration, such as shown in FIG. 4, is not required for operation of the illustrative embodiments. To the contrary, the mechanisms of the illustrative embodiments may be utilized in any interpolative VCO in which programmable delay cells may be provided. Thus, for example, other types of ring oscillator architectures may be used with the programmable delay cells of the present invention.

Figure 1:
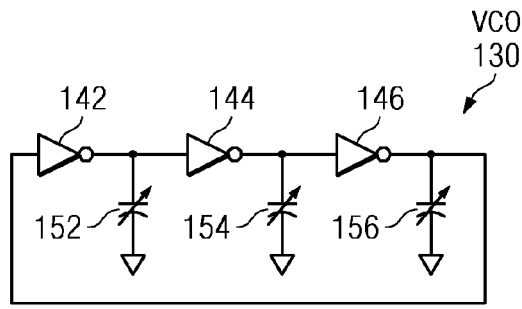
FIG. 1 is a diagram of a typical ring voltage controlled oscillator in which a number of delay stages drive each other in a ring to achieve oscillation.
Figure 2:
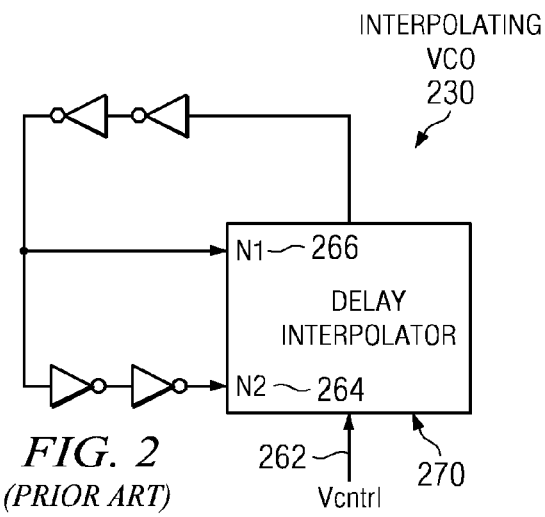
FIG. 2 is a diagram of a typical delay interpolating tuning ring oscillator.
Figure 3:
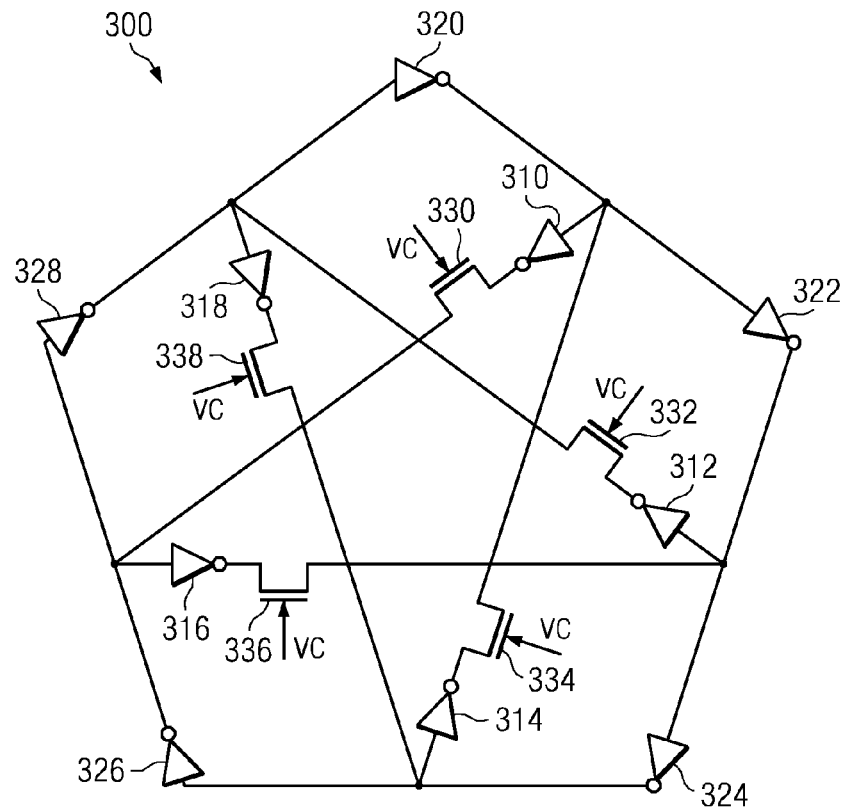
FIG. 3 is a diagram of a known interpolative VCO provided in a star structure having an outer ring of main inverters and an inner sub-ring of inverters configured in a star formation.

The architecture of the programmable interpolative VCO 400 is similar to that of the known architecture shown in FIG. 3 with some important improvements not known prior to the creation of the present invention. Specifically, the fixed size inverters of the known architecture of FIG. 3 are replaced with programmable delay cells 410-418 referred to herein as the programmable main ring buffers (MBs) 410-418 and the programmable control path buffers (CBs) 420-428. The programmable MBs 410-418 form an outer loop of the programmable interpolative VCO 400 while the programmable CBs 420-428 form an internal loop whose control path links are provided in a star geometry. In addition to the CBs 420-428, the control path links further include control path gates 430-438, which may be transistors for example, that receive a control voltage Vc for controlling an amount by which the control paths amplify the signal of the main ring. That is, logic gate based elements, such as the MBs 410-418 and the CBs 420-428, are signal amplifiers. By controlling the amount of control voltage Vc provided to the control path gates 430-438, the conduction of the control path gate 430-438 is increased/decreased and thus, the amount of amplification performed by the associated CBs 420-428 may be controlled. For example, by increasing the conduction of the control path gates 430-438, the signal being conducted by the main ring or outer loop is supplemented so that the rising edges of the signal rise faster with regard to signal timing. Moreover, as will be described hereafter, by selecting the size or strength of the CBs 420-428, the range of frequency changes possible by the CBs 420-428 for a given range of Vc is controllable.

With the programmable interpolative VCO 400 of FIG. 4, the MBs 410-418 and CBs 420-428 are programmable by the input of digital control signals MS[M:1] and CS[N:1], respectively, to control the buffer size of the MBs 410-418 and CBs 420-428. As mentioned above, the "size" of the buffer is synonymous with the strength of the buffer path. The terms "size" and "strength" in this context are generally known in the art, as discussed above. The control signals may be provided by a controller (not shown) that sets the values for the digital control signals to select the desired buffer size of the MBs 410-418 and CBs 420-428.

The control signals effectively turn on/off individual buffers provided within the MBs 410-418 and CBs 420-428. That is, each MB 410-418 and CB 420-428 comprises a plurality of buffers that may be individually enabled by the digital control signals MS[M:1] and CS[N:1], respectively. Each bit in the digital control signals MS[M:1] and CS[N:1] is associated with a particular buffer within the respective MB 410-418 or CB 420-428 and thus, indicates whether that particular buffer is turned on or off, i.e. enabled or not. By turning on/off individual buffers in each of the MBs 410-418 and CBs 420-428, different buffer sizes or strengths may be achieved for the programmable MBs 410-418 and CBs 420-428. Thus, by setting the MS[M:1] control signals appropriately, a desired buffer size or strength of the MBs 410-418 of the main ring or outer ring may be achieved. Similarly, by setting the CS[N:1] control signals appropriately, a desired buffer size or strength of the CBs 420-428 may be achieved.

The MBs 410-418 may have a first number of buffers M while the CBs 420-428 may have a second number of buffers N. In one illustrative embodiment, the buffers within an MB 410-418 or a CB 420-428 are approximately of the same buffer size or strength. However, in other illustrative embodiments, the buffers within a MB 410-418 or a CB 420-428 may have different buffer sizes or strengths and may be individually controlled based on their respective buffer sizes or strengths. Assuming approximately a uniform buffer size/strength within a MB 410-418 or CB 420-428, the greater the number of buffers turned on in a programmable delay cell (MB or CB), the larger the amplification performed by the programmable delay cell. The number of buffers turned on in the MBs 410-418 may be different from that of the CBs 420-428. Moreover, the particular ones of the buffers within the MBs 410-418 or CBs 420-428 that are turned on may be different between MBs 410-418 and CBs 420-428. For example, in an embodiment in which buffers within a MB 410-418 or CB 420-428 may have different buffer sizes/strengths, the particular ones of the buffers turned on in the MBs 410-418 may be different from the particular ones of the buffers turned on in the CBs 420-428 in order to achieve a different buffer size/strength of the MBs 410-418 from that of the CBs 420-428.

In general, the CBs 420-428 will have a smaller buffer size or strength than the MBs 410-418. This is because the inner paths should only make incremental changes to the quiescent state of the main ring. The inner ring is only one inverter or stage delay versus 3 inverter or stage delays of the outer or main ring. The delays of the main ring and the inner ring should be roughly of the same magnitude, i.e. main ring 3 stage delays≈1 inner ring delay.

For example, the MBs 410-418 may have a buffer size or strength that is 2, 3, 4, etc. times that of the CBs 420-428. This ratio of strengths, e.g., 2:1, 3:1, 4:1, etc., may be controlled through proper application of the control signals MS[M:1] and CS[N:1]. The programmed buffer size/strength of the MBs 410-418, as dictated by the control signals MS[M:1], controls the minimum frequency of the programmable interpolative VCO 400. The maximum frequency of the programmable interpolative VCO 400 is determined by the ratio of the buffer size/strength of the outer ring MBs 410-418 to the buffer size/strength of the inner ring CBs 420-428. That is, if "Gm" is the buffer size/strength, then Gm(M) is the buffer size/strength of the MBs 410-418 and Gm(N) is the buffer size/strength of the CBs 420-428. Thus, the maximum frequency of the programmable interpolative VCO 400 is the ratio of Gm(M) to Gm(N) or Gm(M)/Gm(N). Thus, by controlling the control signals MS[M:1] the minimum frequency output of the programmable interpolative VCO 400 may be controlled. By controlling the control signals CS[N:1] the range of possible output frequencies of the programmable interpolative VCO 400 from the minimum frequency defined by the control signals MS[M:1] may be controlled.

Figure 5:
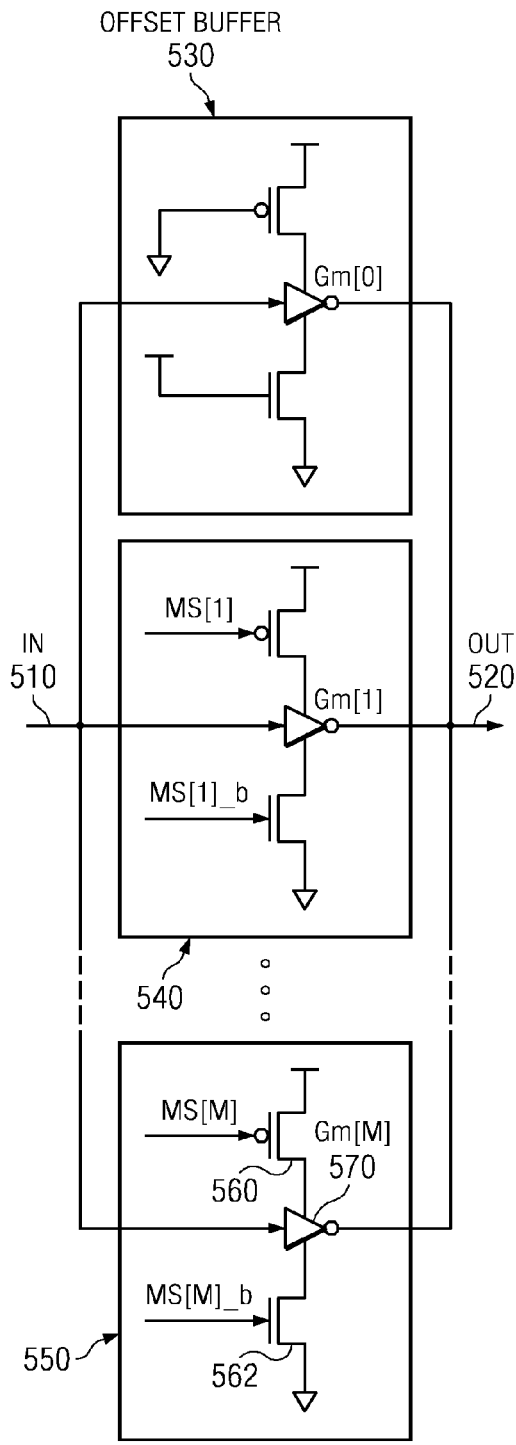
FIG. 5 is an exemplary diagram of a main ring programmable delay cell in accordance with one illustrative embodiment.

FIG. 5 is an exemplary diagram of a main ring programmable delay cell in accordance with one illustrative embodiment. As shown in FIG. 5, the main ring programmable delay cell, e.g., MBs 410-418 of FIG. 4, comprises an input port 510, an output port 520, and a plurality of buffers 530-550 coupled to both the input port 510 and the output port 520 in parallel. Each of the buffers 530-550 are comprised of a pair of gates or transistors 560-562 and an inverter or buffer 570. One of the buffers 530-550, e.g., buffer 530, may be provided as an offset buffer which is always enabled. The other buffers 540-550 may be turned on/off by the application of appropriate control signals MS[M:1] and their complement to the gates or transistors 560-562. Thus, for example, if the control signal MS[M:1] indicates that MS[1] is at a high logic level, e.g., a logic 1 state, then the buffer 540 may be turned on or enabled. Similarly, if the control signal MS[M:1] indicates that MS[M] is at a high logic level, then the buffer 550 may be turned on or enabled. By selectively turning on/off individual buffers 540-550 in this manner, various buffer sizes/strengths of the overall main ring programmable delay cell may be achieved. This allows for the programmability or selection of a desired minimum frequency output of the programmable interpolative VCO.

Figure 6:
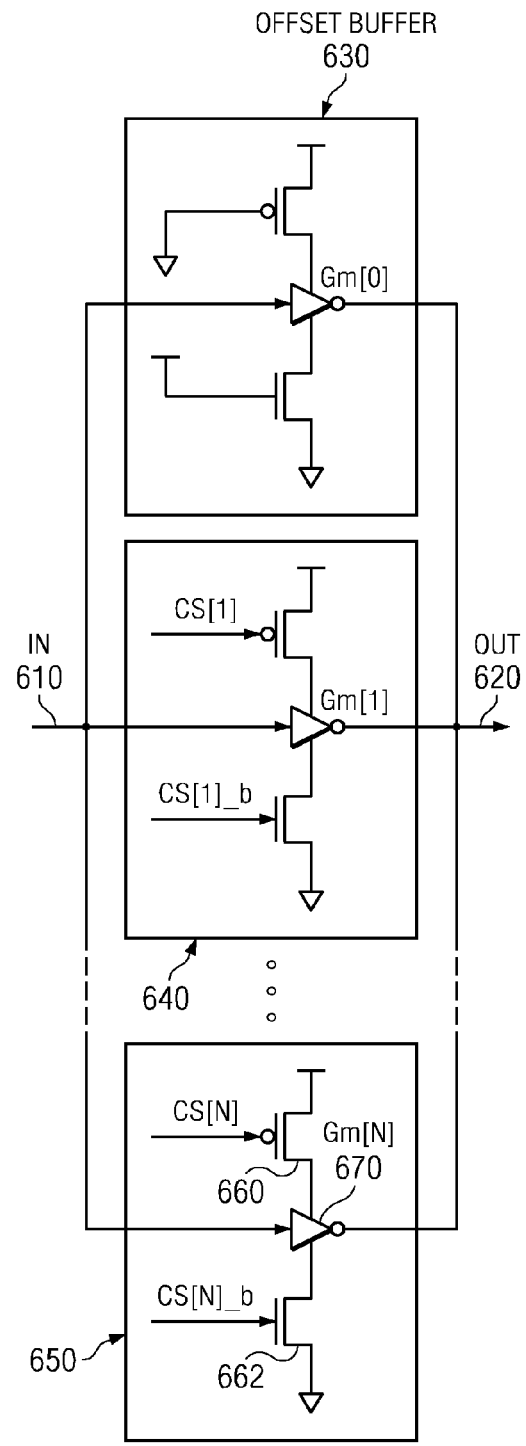
FIG. 6 is an exemplary diagram of a control path programmable delay cell in accordance with one illustrative embodiment.

FIG. 6 is an exemplary diagram of a control path programmable delay cell in accordance with one illustrative embodiment. The control path programmable delay cells are similar to the main ring programmable delay cells but may have different numbers of buffers which themselves have a different buffer size/strength than the buffers provided within the main ring programmable delay cells. As shown in FIG. 6, the control path programmable delay cell, e.g., CBs 420-428 of FIG. 4, comprises an input port 610, an output port 620, and a plurality of buffers 630-650 coupled to both the input port 610 and the output port 620 in parallel. Each of the buffers 630-650 are comprised of a pair of gates or transistors 660-662 and an inverter or buffer 670. One of the buffers 630-650, e.g., buffer 630, may be provided as an offset buffer which is always enabled. The other buffers 640-650 may be turned on/off by the application of appropriate control signals CS[N:1] and their complement to the gates or transistors 660-662. Thus, for example, if the control signal CS[N:1] indicates that CS[1] is at a high logic level, e.g., a logic 1 state, then the buffer 640 may be turned on or enabled. Similarly, if the control signal CS[N:1] indicates that CS[N] is at a high logic level, then the buffer 650 may be turned on or enabled. By selectively turning on/off individual buffers 640-650 in this manner, various buffer sizes/strengths of the overall main ring programmable delay cell may be achieved. This allows for the programmability or selection of a desired minimum frequency output of the programmable interpolative VCO.

The buffers 630-650 of the control path programmable delay cells are preferably of a lower fixed buffer size or strength than the buffers 530-550 of the main ring programmable delay cells. For example, assuming an approximately uniform buffer size or strength of each of the buffers within a programmable delay cell, e.g., each of buffers 630-650 has approximately the same buffer size/strength, the buffers 530-550 may be twice, three times, four times, etc., the buffer size/strength of the corresponding buffers 630-650. Thus, for example, the buffer size/strength of buffer 530 may be twice the buffer size/strength of the buffer 630. While the buffers 530-550 and 630-650 individually have a fixed buffer size/strength, the overall programmable delay cell has a variable buffer size/strength by virtue of the ability to selectively turn on/off individual ones of the buffers within the programmable delay cell.

As discussed above, the control signals MS[M:1] and CS[N:1] may be provided to the programmable interpolative VCO by a controller. The controller may be programmed or hardwired to include relationships between the number M and N of the buffers in the MBs and CBs, respectively, that should be turned on/off to achieve a desired minimum frequency output and frequency output range of the programmable interpolative VCO. These relationships will now be described with regard to plots of these relationships in FIGS. 7-9. It will be appreciated that these relationships that are depicted in these plots may be represented in mathematical form, as a look-up table, or any other control mechanism for use in generating control signals MS[M:1] and CS[N:1] by a controller.

Figure 7:
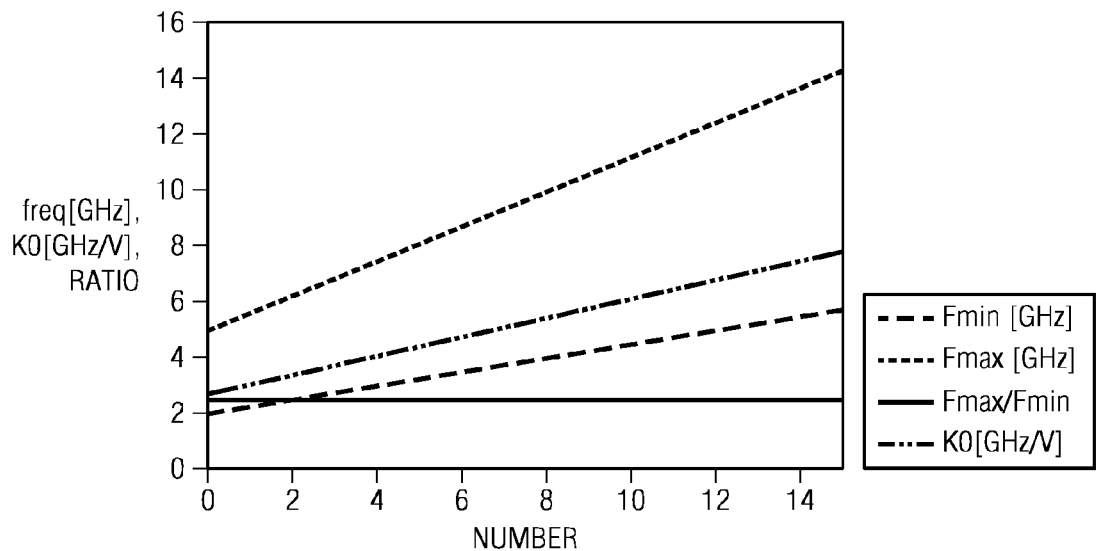
FIG. 7 is a plot of frequency versus number of programmable delay cell buffers turned on in accordance with one illustrative embodiment.

FIG. 7 is a plot of frequency versus number of programmable delay cell buffers turned on in accordance with one illustrative embodiment. In this first plot, it is assumed that the controller is programmed or hard-wired to maintain the total buffer size/strength of the main ring MBs equal to the total buffer size/strength of the inner ring, or control path, CBs. In FIG. 7, as well as the other plots in FIGS. 8-9, the y-axis represents, with regard to respective ones of the curves as labeled in the figure, the resulting output frequency F in GHz, the VCO gain K0 in GHz/V, and the ratio of Fmax to Fmin, i.e. Fmax/Fmin. The x-axis represents the number of buffers turned on within each of the MBs and/or CBs. As the number of buffers that are turned on increases along the x-axis, the corresponding buffer size/strength of the MB and/or CB is increased. An x value of 0 represents a single buffer being turned on in each of the MBs and/or CBs.

Figure 8:
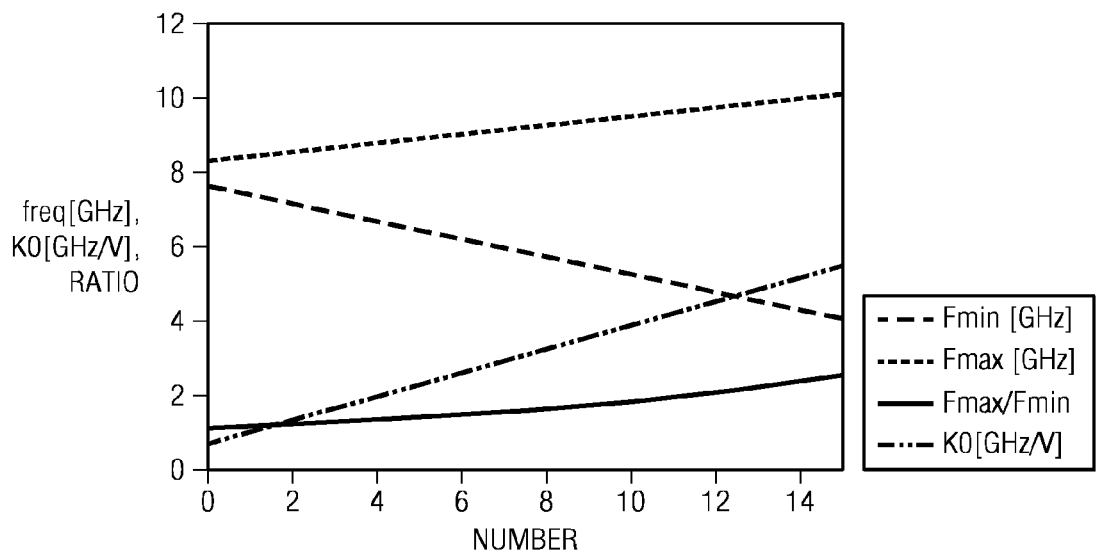
FIG. 8 is a plot of frequency versus number of programmable delay cell buffers turned on in accordance with another illustrative embodiment.
Figure 9:
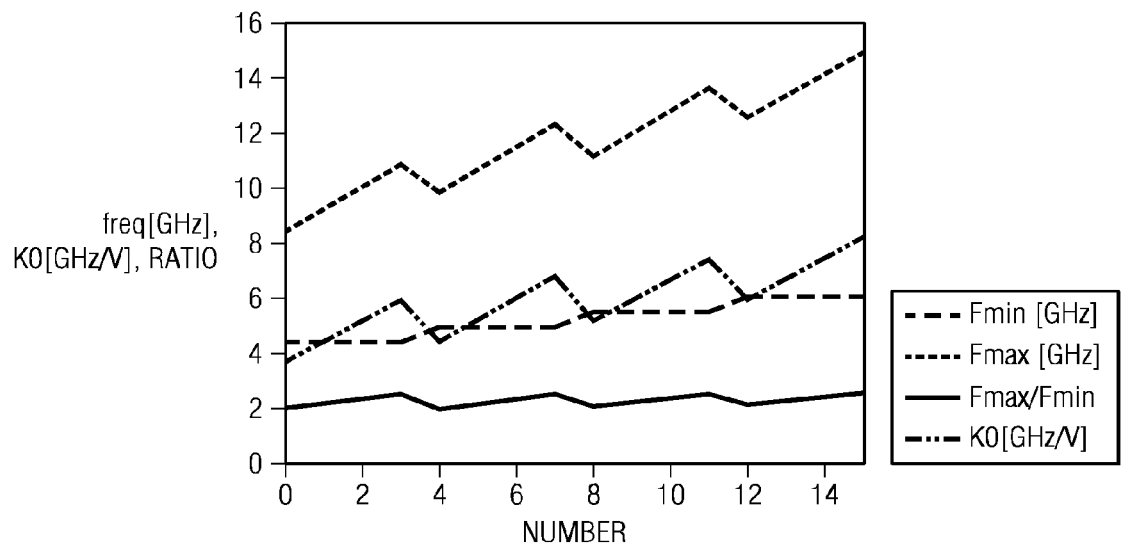
FIG. 9 is a plot of frequency versus number of programmable delay cell buffers turned on in accordance with a third illustrative embodiment.

In the plot shown in FIG. 7, as well as the other plots in FIGS. 8 and 9, the curve representing the minimum frequency Fmin is controlled primarily by the number of buffers within the MBs turned on, as represented by the numbers along the x-axis. The curve representing the maximum frequency Fmax is controlled primarily by the number of buffers within the CBs turned on, also as represented by the numbers along the x-axis. The y-axis represents the resulting output frequency. It will be appreciated that any value between these two curves, at any point along the x-axis, may be achieved through variation of the control voltage Vc. Thus, the area between the Fmin and Fmax curves represents the frequency range of the programmable interpolative VCO.

As shown in FIG. 7, when the number of buffers, in excess of the offset buffer, turned on in both the MBs and CBs is 0, and the control voltage Vc is 0, the Fmin value is approximately 2 GHz. When the number of buffers, in excess of the offset buffer, turned on in both the MBs and CBs is 0, and the control voltage Vc is Vdd, the Fmax value is approximately 5 GHz. Thus, with no other buffers enabled, the programmable interpolative VCO is able to achieve a frequency output range of 2 to 5 GHz. This range may be increased as the number of buffers turned on in the MBs and CBs is increased. For example, by setting the number of buffers M turned on in the MBs to 0 and the number of buffers N turned on in the CBs to 14, a range of approximately 2 to 14 GHz is made possible with the programmable interpolative VCO of the present invention. Of course, any other desirable frequency range may also be selected by changing the combination of number of buffers M turned on in the MBs and the number of buffers N turned on in the CBs.

The ratio of Fmax to Fmin remains virtually constant at approximately 2.5 as the number of buffers turned on is increased. The VCO gain K0 increases at approximately the same slope of the Vc=0 curve, i.e. the Fmin curve. This provides a desirable result in that the ratio of Fmax to Fmin should be as large as possible with the VCO gain K0 being the important factor governing PLL performance. Thus, an adjustable K0 gives additional design flexibility in the PLL while maintaining as high as possible a ratio of Fmax to Fmin.

It should be appreciated that with the known architecture shown in FIG. 3, rather than the variability of the frequency range achieved through the mechanisms of the illustrative embodiments, the plot would be a straight vertical line at one of the x-axis values. That is, the buffer size/strength in the known architecture is fixed and thus, the range of frequency output is fixed. Thus, with the known architecture, a range of 2 to 5 GHz may be achievable, for example, but there is no ability to increase this range by programmatically changing the buffer size/strength of the main ring delay elements and control path delay elements.

FIG. 8 is a plot of frequency versus number of programmable delay cell buffers turned on in accordance with another illustrative embodiment. In this illustrative embodiment, rather than making the total buffer size/strength of the MBs equal to the total buffer size/strength of the CBs, the overall total buffer size/strength of the combination of MBs and CBs is maintained. Thus, if the buffer size/strength of the main ring programmable delay cells is increased, the buffer size/strength of the control path programmable delay cells is correspondingly weakened in this illustrative embodiment to maintain the total buffer size/strength of the combination of MBs and CBs. Such an illustrative embodiment may be useful for applications that are sensitive to VCO gain K0. That is, the application may need to maintain K0 as low as possible while achieving high frequency outputs.

As shown in FIG. 8, when the number of buffers in the MBs is 0, and Vc is 0, the frequency output of the programmable interpolative VCO is approximately 7.5 GHz. When the number of buffers in the CBs is 0, and the Vc is Vdd, the frequency output of the programmable interpolative VCO is approximately 8.25 GHz. This range is increased as the number of buffers turned on in each of the MBs and CBs is increased. In the plot, at a number of buffers M=14 turned on in the MBs, the Fmin is approximately 4.25 GHz. At a number of buffers M=14 turned on in the CBs, the Fmax is approximately 10 GHz. This is because Fmin is related to the outer or main loop buffers while the Fmax value is related to a combination of the inner and outer or main loop buffers.

As shown in FIG. 8, the VCO gain K0 increases from approximately 1 to 6 GHz/V over the range of number of buffers turned on shown in the plot. Compared to the K0 values in FIG. 7, which range from 2.5 to 8, this is a significant decrease in the gain of the VCO. The Fmax/Fmin curve is reduced from that of FIG. 7, i.e. from approximately 2.5 to approximately 1.0, and increases slightly as the number of buffers turned on increases up to approximately 2.5 in the plot shown. As discussed previously, for many applications it is beneficial to have a large Fmax/Fmin curve while providing variability in the K0 value. However, in some applications a lower Fmax/Fmin and less variability in the K0 value is acceptable and even desirable, such as applications where the operation is sensitive to changes in K0.

FIG. 9 is a plot of frequency versus number of programmable delay cell buffers turned on in accordance with a third illustrative embodiment. This illustrative embodiment uses programmable delay cells of different strengths within each of the main or outer ring and the inner ring, or control path ring. That is, it is not required that each of the programmable delay cells in the ring have the same buffer size/strength. Different buffer sizes/strengths may be used without departing from the spirit and scope of the present invention. In particular, the depicted example uses 4 different strength programmable delay cells in the main ring and inner ring. This gives rise to the stair-stepped type curves shown in FIG. 9. The trends of these curves are approximately the same as in the embodiment shown in FIG. 7 above but with the stair-stepped effect of having programmable delay cells of different strengths.

Thus, various control methodologies may be used to control the minimum and maximum frequency outputs of a programmable interpolative VCO according to the illustrative embodiments as well as the range of possible frequency outputs. The programmability of the VCO of the illustrative embodiments allows for more versatility in using the VCO for various customer applications as well as modifying the operation of the VCO as needs change.

Figure 10:
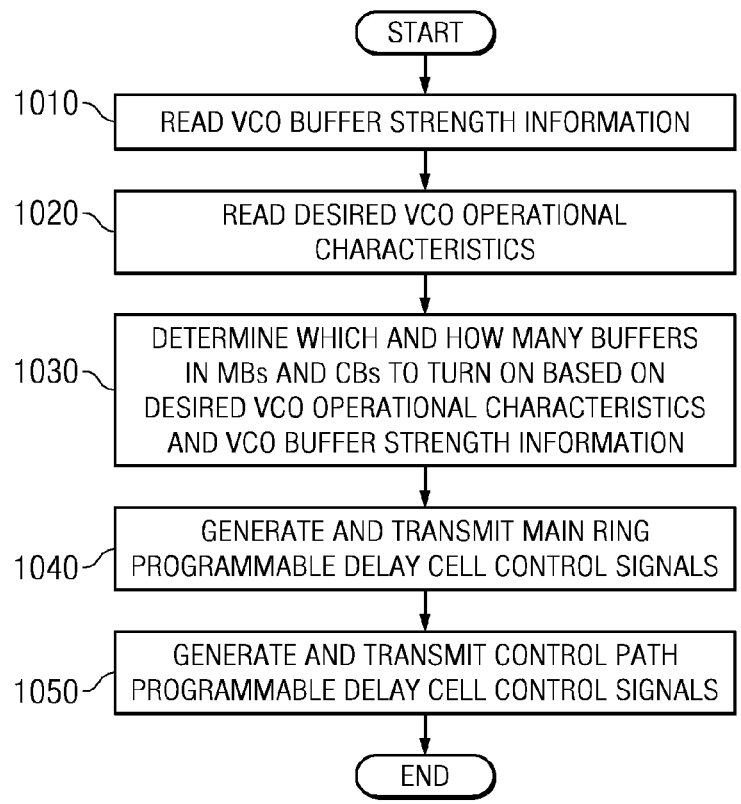
FIG. 10 is a flowchart outlining an exemplary operation for controlling the output frequency range of a programmable interpolative VCO in accordance with one illustrative embodiment.

FIG. 10 is a flowchart outlining an exemplary operation for controlling the output frequency range of a programmable interpolative VCO in accordance with one illustrative embodiment. The operation outlined in FIG. 10 may be implemented, for example, by a controller or similar element that operates to program the operation of a programmable interpolative VCO in accordance with one illustrative embodiment. Thus, the operation outlined in FIG. 10 may be implemented in hardware, software, or any combination of hardware and software.

It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 10, the operation starts with the controller reading VCO buffer strength information from a data storage (step 1010). The controller also reads desired operational characteristics for the VCO, which may also be read from the same or a different data storage (step 1020). These operational characteristics may represent, for example, a set of user defined or system defined parameters for governing the desired operation of the VCO, e.g., desired VCO gain, frequency range, Fmax/Fmin ratio, etc. These desired operational characteristics are used along with the VCO buffer strength information to determine which and how many of the buffers in each of the MBs and CBs of the VCO to turn on (step 1030). The controller generates and transmits a corresponding main ring programmable delay cell control signal to the main ring programmable delay cells, e.g., MBs (step 1040). The controller generates and transmits a corresponding control path programmable delay cell control signal to the control path programmable delay cells, e.g., CBs (step 1050). The operation then terminates.

Figure 11:
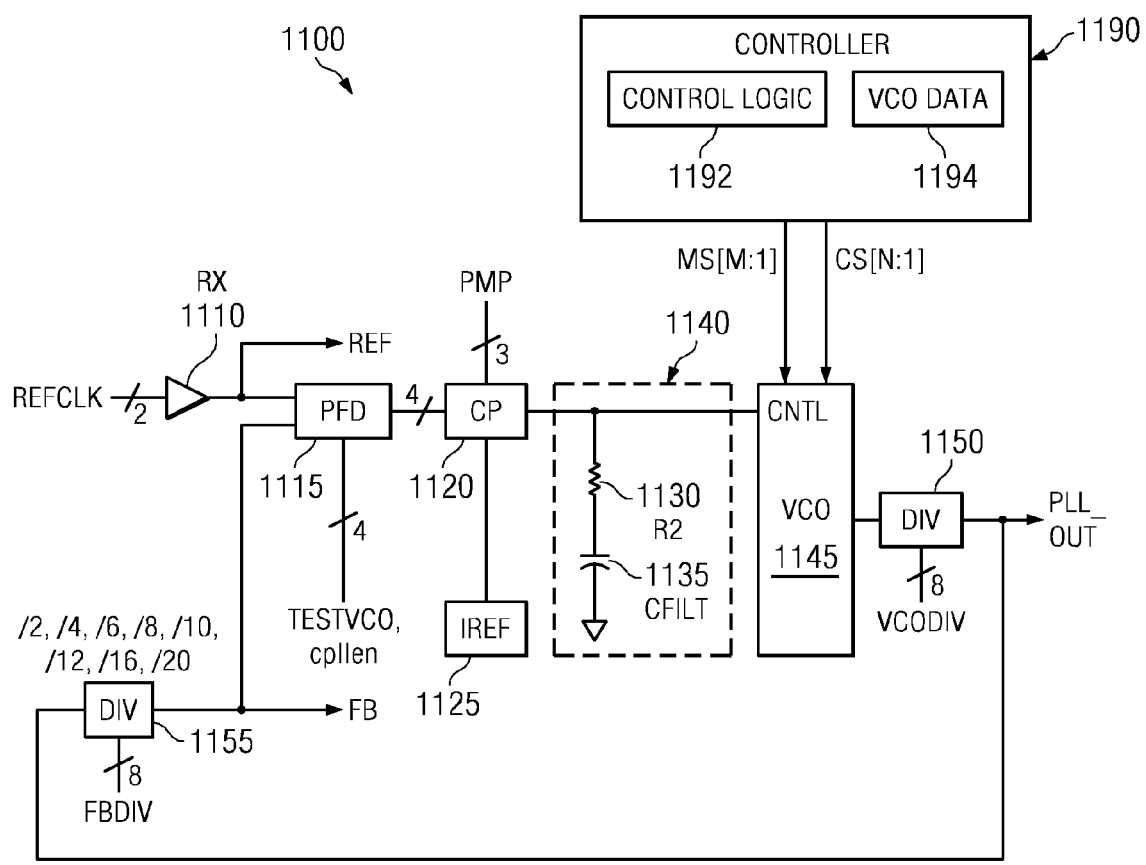
FIG. 11 is an exemplary diagram of a phase-locked loop (PLL) circuit in which the programmable interpolative VCO of the present invention may be implemented.

FIG. 11 is an exemplary diagram of a phase-locked loop (PLL) circuit in which the programmable interpolative VCO of the present invention may be implemented. As shown in FIG. 11, the PLL circuit 1100 includes a receiver (RX) 1110 coupled to a phase frequency detector (PFD) 1115 which is in turn coupled to a charge pump (CP) 1120. A reference current signal from a reference current circuit (IREF) 1125 is provided as an input to the charge pump 1120 along with a control input, via a PMP bus for example, specifying the setting of the charge pump 1120. The control input, which is set by a configuration register or is hard-wired into the circuit, sets the peak current for the charge pump 1120. The charge pump is coupled to a resistor (R2) 1130 and capacitor (CFILT) 1135 which together constitute a resistance/capacitance (RC) filter 1140 (also sometimes referred to as a "loop filter"). The RC filter 1140 is coupled to a voltage controlled oscillator (VCO) 1145 which in turn is coupled to a first divider 1150. A feedback path is provided back to the input of the PFD 1115 via a second divider 1155.

The PLL circuit 1100 operates in a manner generally known in the art with the exception of the operation of the VCO 1145 which operates in accordance with the programmable interpolative VCO of the illustrative embodiments. That is, assuming the PLL circuit 1100 is used for generating a core clock signal for a processor or other integrated circuit device, a reference clock signal is provided to the PLL circuit 1100 via receiver 1110. Preferably, the input to the receiver 1110 is coupled to an external reference clock while the output of the first divider 1150 is coupled to a clock input of a processor or other integrated circuit device. This reference clock signal is input to the phase frequency detector 1115 which also receives as an input a feedback clock signal from the second divider 1155, which divides the feedback signal from the first divider 1150 by a programmable amount. The phase frequency detector 1115 compares the feedback clock signal from the second divider 1155 and detects a difference in phase and frequency between the reference clock signal and the feedback clock signal. The phase frequency detector 1115 then generates an "up" or "down" control signal based on whether the feedback clock signal frequency is lagging or leading the reference clock signal frequency. These "up" or "down" control signals determine whether the VCO 1145 needs to operate at a higher or lower frequency, respectively.

The PFD 1115 outputs these "up" and "down" signals to the charge pump 1120. If the charge pump 1120 receives an "up" control signal, current is driven into the RC filter 1140. Conversely, if the charge pump 1120 receives a "down" control signal, current is drawn from the RC filter 1140. The RC filter 1140 converts these control signals into a control voltage that is used to bias the VCO 1145. Based on the control voltage, the VCO 1145 oscillates at a higher or lower frequency, which affects the phase and frequency of the feedback clock signal. If the PFD 1115 produces an "up" control signal, then the VCO 1145 frequency is increased. If the PFD 1115 produces a "down" control signal, then the VCO 1145 frequency is decreased. The VCO stabilizes once the reference clock signal and the feedback clock signal have the same phase and frequency. When the reference clock signal and the feedback clock signal are aligned, the PLL circuit 1100 is considered locked.

The RC filter 1140 operates to filter out jitter from the charge pump 1120 output and to prevent voltage overshoot. Thus, the operation of the RC filter 1140 affects the damping factor of the RC PLL circuit 1100. The first and second dividers 1150 and 1155 operate to increase the VCO 1145 frequency above the reference frequency of the reference clock signal. That is, the VCO 1145 frequency is equal to a multiple of the reference clock signal frequency which may then be reduced by the divider circuits 1150 and 1155.

The VCO 1145 is preferably a programmable interpolative VCO in accordance with one of the illustrative embodiments described previously above. As shown in FIG. 11, the programmable interpolative VCO 1145 receives as control inputs the control signals MS[M:1] and CS[N:1] for controlling the number of buffers turned on in the main ring and control paths of the VCO 1145. These control signal inputs may be generated by a controller 1190. The controller 1190 may include programmable interpolative VCO control logic 1192 which may be implemented in hardware, software, or any combination of hardware and software. The control logic 1192 may operate based on data stored in the programmable interpolative VCO control data storage 1194. This data may represent information about the buffer sizes/strengths in the MBs and CBs of the VCO 1145, a lookup table of the relative curves of the various plots described above, or the like. Based on this data and the control logic 1192, the controller 1190 may generate the control signals MS[M:1] and CS[N:1] for controlling the operation of the programmable interpolative VCO 1145 to achieve a desired minimum frequency Fmin, maximum frequency Fmax, VCO gain, and frequency output range.

Figure 12:
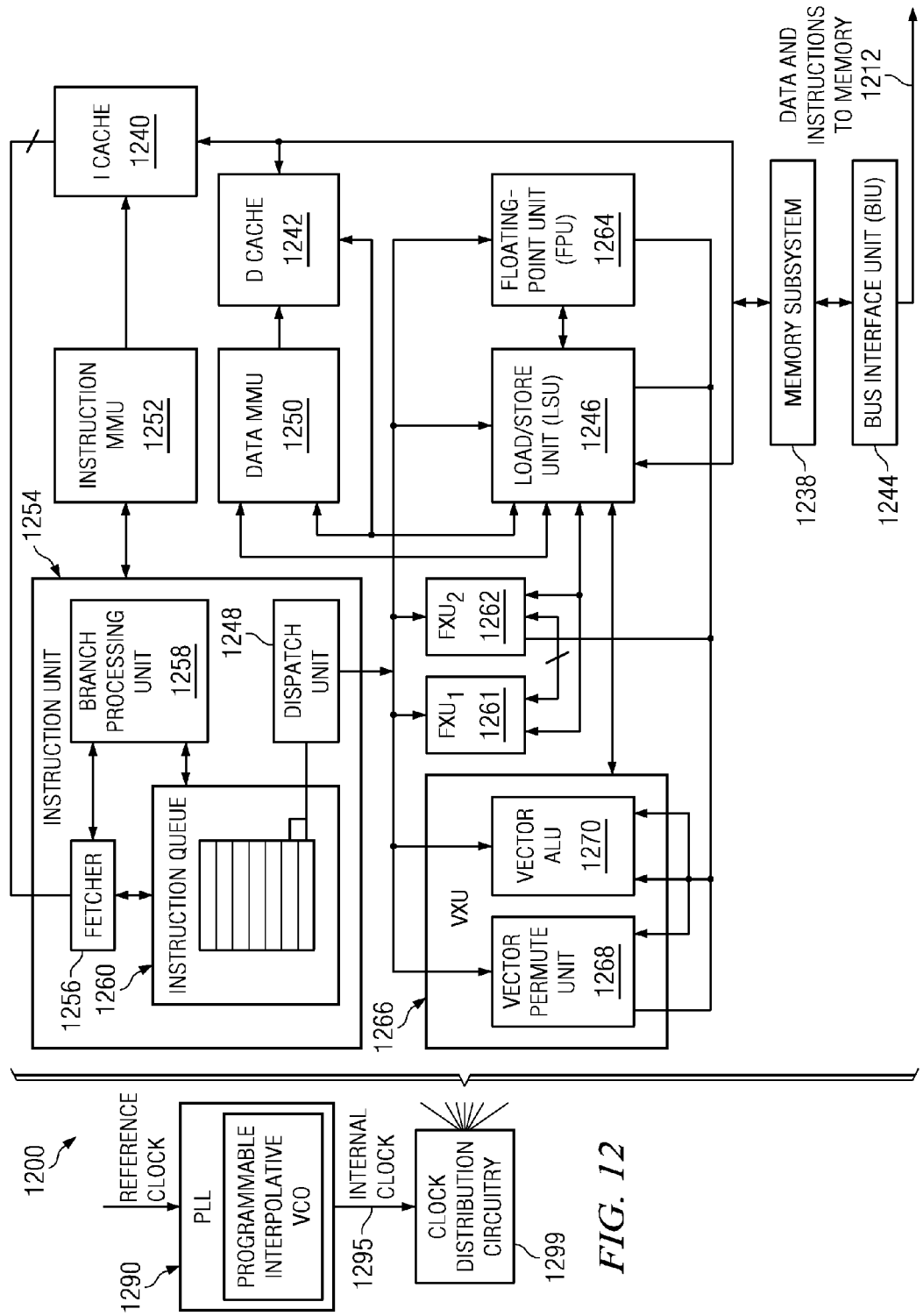
FIG. 12 is an exemplary diagram of a data processing device in which the programmable interpolative VCO may be utilized such as part of a PLL circuit, in accordance with one illustrative embodiment.

FIG. 12 is an exemplary diagram of a data processing device in which the programmable interpolative VCO may be utilized, such as part of a PLL circuit, in accordance with one illustrative embodiment. The VCO of the illustrative embodiments may be implemented in a number of different types of circuit devices. One particular implementation of the VCO of the illustrative embodiments to note is in the generation of internal clock signals for processors of data processing devices by use of the VCO in a PLL circuit. FIG. 12 is an exemplary diagram of a processor in which a PLL implementing the programmable interpolative VCO of the illustrative embodiments may be utilized. The depiction of the processor in FIG. 12 is provided as a high-level functional block diagram of selected operational blocks that may be included in a central processing unit (CPU) 1200.

In one illustrated embodiment, CPU 1200 includes internal instruction cache (I-cache) 1240 and data cache (D-cache) 1242 which are accessible to memory (not shown in FIG. 12) through bus 1212, bus interface unit 1244, memory subsystem 1238, load/store unit (LSU) 1246 and corresponding memory management units: data MMU 1250 and instruction MMU 1252. In the depicted architecture, CPU 1200 operates on data in response to instructions retrieved from I-cache 1240 through instruction dispatch unit 1248. Dispatch unit 1248 may be included in instruction unit 1254 which may also incorporate fetcher 1256 and branch processing unit 1258 that controls instruction branching.

An instruction queue 1260 may interface fetcher 1256 and dispatch unit 1248. In response to dispatched instructions, data retrieved from D-cache 1242 by load/store unit 1246 can be operated upon by one of fixed-point unit (FXU) 1261, FXU 1262 or floating-point execution unit (FPU) 1264. Additionally, CPU 1200 provides for parallel processing of multiple data items via vector execution unit (VXU) 1266. VXU 1266 may include a vector permute unit 1268 that performs permutation operations on vector operands, and a vector arithmetic logic unit (VALU) 1270 that performs vector arithmetic operations such as fixed-point and floating-point operations on vector operands.

Each unit, such as instruction unit 1254, VXU 1266, FXUs 1261 and 1262, LSU 1246, and FPU 1264, along the instruction pipelines, are enabled and synchronized by an internal clock signal 1295. Such an internal clock signal 1295 may be generated using an output of the PLL 1290 that utilizes the programmable interpolative VCO of the illustrative embodiments and may be distributed to the various units via clock distribution circuitry 1299. While the PLL 1290 implementing the VCO of the illustrative embodiments may be used to provide a clock signal for enabling and synchronizing the units of the processor 1200, the PLL implementing the VCO of the illustrative embodiments may be used to provide other types of signals as well depending upon the particular use to which the PLL is put.

It should be appreciated that portions of the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The circuitry as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 13:
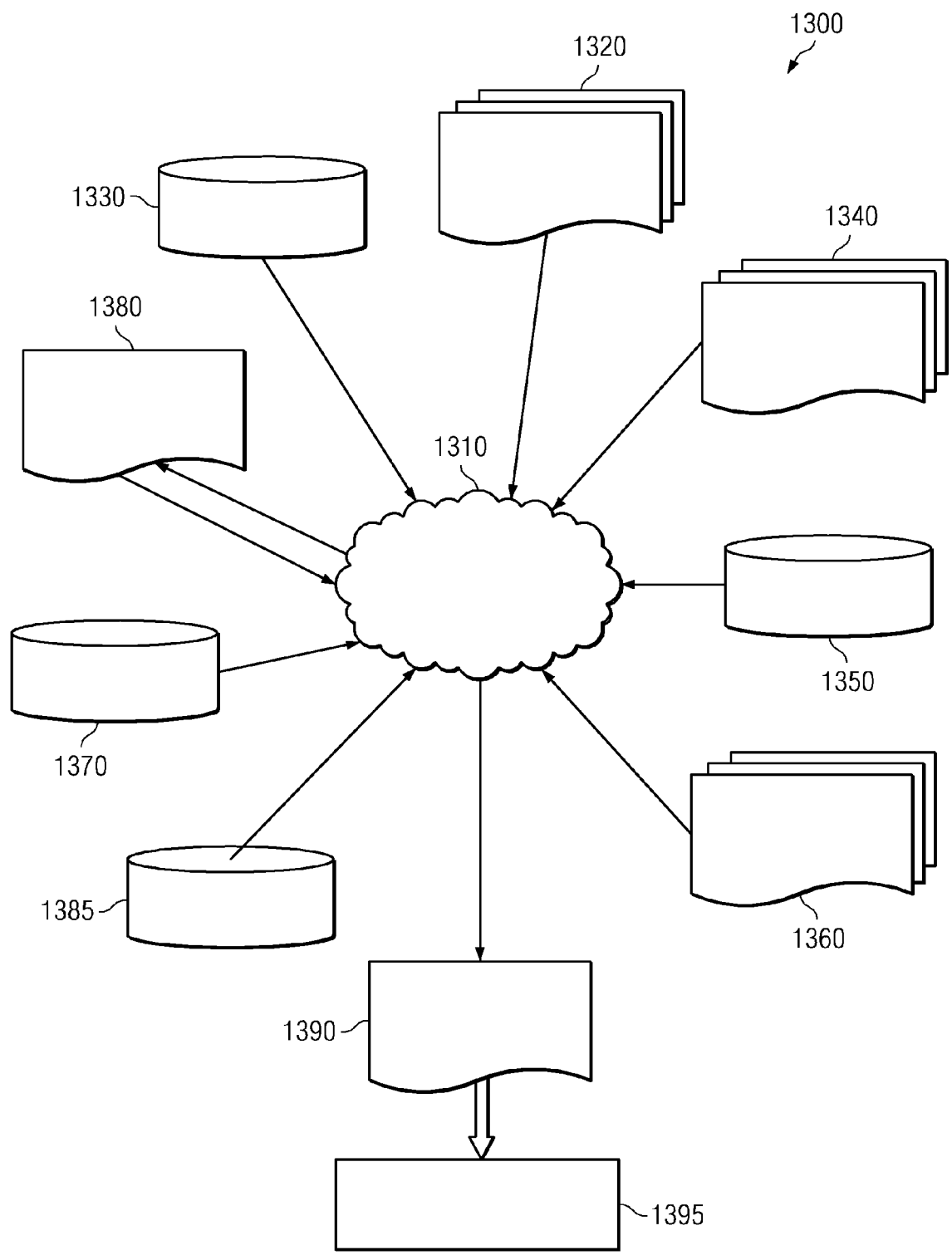
FIG. 13 is a flow diagram of a design process used in semiconductor design, manufacture, and/or test.

FIG. 13 shows a block diagram of an exemplary design flow 1300 used for example, in semiconductor IC logic design, simulation, test, layout, and manufacture. Design flow 1300 includes processes and mechanisms for processing design structures to generate logically or otherwise functionally equivalent representations of the embodiments of the invention shown in FIGS. 4-6 and 11-12. The design structures processed and/or generated by design flow 1300 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 13 illustrates multiple such design structures including an input design structure 1320 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission or storage medium, design structure 1320 may be accessed and processed by one or more hardware and/or software modules within design process 1310 to simulate or otherwise functionally represent an electronic component, circuit, electronic or logic module, apparatus, device, or system such as those shown in FIGS. 4-6 and 11-12. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown in FIGS. 3, 5A-5B, and 11 to generate a netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1360, design rules 1370, and test data files 1385 which may include input test patterns, output test results, and other testing information. Design process 1310 may further include modules for performing standard circuit design processes such as timing analysis, verification, design rule checking, place and route operations, etc.

Design process 1310 employs and incorporates well-known logic and physical design tools such as HDL compilers and simulation model build tools to process design structure 1320 together with some or all of the depicted supporting data structures to generate a second design structure 1390. Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-6 and 11-12. In one embodiment, design structure 1390 may comprise a compiled, executable HDL simulation model that functionally simulates the devices shown in FIGS. 4-6 and 11-12.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 4-6 and 11-12. Design structure 1390 may then proceed to a stage 1395 where, for example, design structure 1390 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A design structure embodied in a non-transitory machine readable storage device for designing, manufacturing, or testing an integrated circuit, the design structure comprising:
   a first design structure element representing a controller; and
   a second design structure element representing a programmable voltage controlled oscillator (VCO) coupled to the controller, wherein the programmable VCO comprises:
   a plurality of third design structure elements representing a plurality of first programmable delay cells coupled to one another;
   a plurality of fourth design structure elements representing a plurality of second programmable delay cells coupled to one another; and
   a plurality of fifth design structure elements representing a plurality of control gates coupled to the plurality of second programmable delay cells, wherein the design structure is configured such that a first control signal is sent from the controller to the plurality of first programmable delay cells to enable a first number of buffers in each of the first programmable delay cells, a second control signal is sent from the controller to the plurality of second programmable delay cells to enable a second number of buffers in each of the second programmable delay cells, and a control voltage is applied to the plurality of control gates.

2. The design structure of claim 1, wherein the design structure is configured such that the plurality of first programmable delay cells are coupled to one another in a main ring formation, the plurality of second programmable delay cells are coupled to one another in an inner ring formation, and the inner ring formation is coupled to the main ring formation.

3. The design structure of claim 1, wherein the design structure is configured such that the controller reads delay cell strength information from a first data storage device for the first programmable delay cells and the second programmable delay cells, and wherein the design structure is configured such that the first control signal and the second control signal are generated by the controller based on the delay cell strength information.

4. The design structure of claim 3, wherein the design structure is configured such that the controller reads desired VCO operational characteristic information from a second data storage, and wherein the design structure is configured such that the first control signal and the second control signal are generated by the controller based on both the delay cell strength information and the desired VCO operational characteristic information.

5. The design structure of claim 4, wherein the desired VCO operational characteristic information is one or more of a set of user defined parameters or system defined parameters for governing a desired operation of the VCO.

6. The design structure of claim 5, wherein the user defined parameters or system defined parameters specify at least one of a desired VCO gain, frequency range, or maximum frequency to minimum frequency (Fmax/Fmin) ratio.

7. The design structure of claim 4, wherein the design structure is configured such that the desired VCO operational characteristic information is used by the controller along with the delay cell strength information to determine how many of the buffers in the delay cells in the plurality of first programmable delay cells and how many of the buffers in the delay cells in the plurality of second programmable delay cells to enable.

8. The design structure of claim 1, wherein the design structure is configured such that the delay cells in the plurality of first programmable delay cells each have an offset buffer and a first number of additional buffers that are selectively enabled based on a setting of bits in the first control signal.

9. The design structure of claim 8, wherein the design structure is configured such that the delay cells in the plurality of second programmable delay cells each have an offset buffer and a second number of additional buffers that are selectively enabled based on a setting of bits in the second control signal.

10. The design structure of claim 1, wherein the design structure defines a phase-locked loop (PLL) circuit.

11. The design structure of claim 1, wherein the design structure is a data processing system, and wherein the controller and programmable VCO are part of a phase-locked loop (PLL) circuit of the data processing system.

12. The design structure of claim 11, wherein the design structure is configured such that the PLL circuit provides an internal clock signal to one or more units of the data processing system.

13. A design structure encoded on a non-transitory machine readable data storage device, said design structure comprising elements that when processed in a computer-aided design system generates a machine-executable representation of a phase locked loop circuit, wherein said design structure comprises:
   a first design structure element representing a controller; and
   a second design structure element representing a programmable voltage controlled oscillator (VCO) coupled to the controller, wherein the programmable VCO comprises:
   a plurality of third design structure elements representing a plurality of first programmable delay cells coupled to one another;
   a plurality of fourth design structure elements representing a plurality of second programmable delay cells coupled to one another; and
   a plurality of fifth design structure elements representing a plurality of control gates coupled to the plurality of second programmable delay cells, wherein the design structure is configured such that a first control signal is sent from the controller to the plurality of first programmable delay cells to enable a first number of buffers in each of the first programmable delay cells, a second control signal is sent from the controller to the plurality of second programmable delay cells to enable a second number of buffers in each of the second programmable delay cells, and a control voltage is applied to the plurality of control gates.

14. The design structure of claim 13, wherein the design structure is configured such that the plurality of first programmable delay cells are coupled to one another in a main ring formation, the plurality of second programmable delay cells are coupled to one another in an inner ring formation, and the inner ring formation is coupled to the main ring formation.

15. The design structure of claim 13, wherein the design structure is configured such that the controller reads delay cell strength information from a first data storage device for the first programmable delay cells and the second programmable delay cells, and wherein the design structure is configured such that the first control signal and the second control signal are generated by the controller based on the delay cell strength information.

16. The design structure of claim 15, wherein the design structure is configured such that the controller reads desired VCO operational characteristic information from a second data storage, and wherein the design structure is configured such that the first control signal and the second control signal are generated by the controller based on both the delay cell strength information and the desired VCO operational characteristic information.

17. The design structure of claim 16, wherein the desired VCO operational characteristic information is one or more of a set of user defined parameters or system defined parameters for governing a desired operation of the VCO.

18. The design structure of claim 17, wherein the user defined parameters or system defined parameters specify at least one of a desired VCO gain, frequency range, or maximum frequency to minimum frequency (Fmax/Fmin) ratio.

19. The design structure of claim 16, wherein the design structure is configured such that the desired VCO operational characteristic information is used by the controller along with the delay cell strength information to determine how many of the buffers in the delay cells in the plurality of first programmable delay cells and how many of the buffers in the delay cells in the plurality of second programmable delay cells to enable.

20. The design structure of claim 13, wherein the design structure is configured such that the delay cells in the plurality of first programmable delay cells each have an offset buffer and a first number of additional buffers that are selectively enabled based on a setting of bits in the first control signal.

21. The design structure of claim 20, wherein the design structure is configured such that the delay cells in the plurality of second programmable delay cells each have an offset buffer and a second number of additional buffers that are selectively enabled based on a setting of bits in the second control signal.

22. A hardware description language (HDL) design structure encoded on a non-transitory machine readable data storage device, said HDL design structure comprising elements that when processed in a computer-aided design system generates a machine-executable representation of a phase locked loop circuit, wherein said HDL design structure comprises:
   a first design structure element representing a controller; and
   a second design structure element representing a programmable voltage controlled oscillator (VCO) coupled to the controller, wherein the programmable VCO comprises:
   a plurality of third design structure elements representing a plurality of first programmable delay cells coupled to one another;
   a plurality of fourth design structure elements representing a plurality of second programmable delay cells coupled to one another; and
   a plurality of fifth design structure elements representing a plurality of control gates coupled to the plurality of second programmable delay cells, wherein the design structure is configured such that a first control signal is sent from the controller to the plurality of first programmable delay cells to enable a first number of buffers in each of the first programmable delay cells, a second control signal is sent from the controller to the plurality of second programmable delay cells to enable a second number of buffers in each of the second programmable delay cells, and a control voltage is applied to the plurality of control gates.

* * * * *